United States Patent
Chandler et al.

(10) Patent No.: US 8,760,306 B2
(45) Date of Patent: *Jun. 24, 2014

(54) SENSOR ARRANGEMENT AND METHOD OF USING THE SAME

(71) Applicant: GM Global Technology Operations LLC, Detroit, MI (US)

(72) Inventors: Andrew K. Chandler, Plymouth, MI (US); Andrew H. Leutheuser, Royal Oak, MI (US); Willard A. Blevins, Glendale, AZ (US); Larry J. Yount, Scottsdale, AZ (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/755,294

(22) Filed: Jan. 31, 2013

(65) Prior Publication Data

US 2013/0141230 A1 Jun. 6, 2013

Related U.S. Application Data

(63) Continuation of application No. 12/579,711, filed on Oct. 15, 2009, now Pat. No. 8,384,354.

(51) Int. Cl.
*G08B 21/00* (2006.01)

(52) U.S. Cl.
USPC .......................... 340/636.1; 340/455; 340/635

(58) Field of Classification Search
None
See application file for complete search history.

(56) References Cited

U.S. PATENT DOCUMENTS

| | | | |
|---|---|---|---|
| 6,411,097 B1 | 6/2002 | Ashtiani et al. | |
| 6,462,550 B2 | 10/2002 | Yudahira | |
| 6,563,291 B2 | 5/2003 | Tamura et al. | |
| 7,403,016 B2 | 7/2008 | Furukawa et al. | |
| 7,804,277 B2 | 9/2010 | Sato | |
| 8,384,354 B2 * | 2/2013 | Chandler et al. | 320/132 |
| 2007/0282459 A1 | 12/2007 | Schafer et al. | |
| 2008/0164881 A1 | 7/2008 | Miyamoto | |
| 2008/0180106 A1 | 7/2008 | Gorbold | |

(Continued)

FOREIGN PATENT DOCUMENTS

| | | |
|---|---|---|
| DE | 102005005995 A1 | 6/2006 |
| DE | 102005048015 A1 | 4/2007 |
| DE | 102007029156 A1 | 1/2009 |

OTHER PUBLICATIONS

German Office Action dated Aug. 3, 2011, (7 pages).

(Continued)

*Primary Examiner* — Travis Hunnings
(74) *Attorney, Agent, or Firm* — Lionel D. Anderson; Reising Ethington P.C.

(57) ABSTRACT

A sensor arrangement and method that may be used with a variety of different energy storage devices, including battery packs found in hybrid vehicles, battery electric vehicles, and other types of vehicles. An exemplary sensor arrangement includes a number of sensor units, a controller, and several connections, wherein two or more sensor units are coupled to each node of the battery pack and are coupled to the controller over different connections. An exemplary method is divided into two aspects: an error detection aspect and an error resolution aspect. Because the sensor arrangement provides multiple sensor readings for each node being evaluated, the method can enable the sensor arrangement to continue operating accurately and with redundancy even if it experiences a loss of one or more sensor units.

22 Claims, 4 Drawing Sheets

(56) References Cited

U.S. PATENT DOCUMENTS

| | | |
|---|---|---|
| 2010/0001693 A1 | 1/2010 | Iida et al. |
| 2010/0073005 A1 | 3/2010 | Yano et al. |
| 2010/0321025 A1 | 12/2010 | Lin et al. |
| 2011/0089953 A1* | 4/2011 | Chandler et al. ............... 324/427 |
| 2011/0187378 A1 | 8/2011 | Boehm et al. |

OTHER PUBLICATIONS

United States Office Action Restriction Dec. 20, 2011, (7 pages).
United States Office Action Mar. 12, 2012, (13 pages).
United States Final Office Action Jul. 24, 2012, (8 pages).

* cited by examiner

SENSOR ARRANGEMENT AND METHOD OF USING THE SAME

REFERENCE TO RELATED APPLICATIONS

This application is a continuation of co-pending U.S. application Ser. No. 12/579,711 filed Oct. 15, 2009, the entire contents of which are incorporated herein by reference.

TECHNICAL FIELD

The present invention generally relates to a sensor arrangement and, more particularly, to a sensor arrangement that may be used with an energy storage device such as a vehicle battery.

BACKGROUND

Hybrid vehicles, battery electric vehicles, and other types of vehicles that use a battery for vehicle propulsion increasingly rely upon battery electronics for proper battery management and operation.

Battery electronics are oftentimes required to put in many hours of service in the field; sometimes, many more hours than is required of other electronic devices found in the vehicle. For example, a typical vehicle electronic module may see 8,000 hours of service over a 15 year period, while certain battery electronics may be required to put in 50,000 hours of service over the same amount of time. This type of increased demand can sometimes result in the battery electronics needing to be serviced or replaced at an accelerated rate.

In addition, certain battery electronics—such as sensors for monitoring battery voltage, current, temperature, etc.—are sometimes packaged and mounted within the actual battery pack. Thus, servicing and/or replacing such battery electronics can be difficult and expensive.

SUMMARY

According to one embodiment, there is provided a method of using a sensor arrangement that evaluates an energy storage device. The method may comprise the steps of: (a) receiving a first sensor reading from a first sensor unit at a controller, wherein the first sensor reading pertains to a parameter for a node of the energy storage device; (b) receiving a second sensor reading from a second sensor unit at the controller, wherein the second sensor reading also pertains to the same parameter for the same node of the energy storage device; and (c) using the first and second sensor readings pertaining to the same node parameter to detect an error with the sensor arrangement and/or the energy storage device.

According to another embodiment, there is provided a method of using a sensor arrangement that evaluates an energy storage device. The method may comprise the steps of: (a) receiving a first sensor reading from a first sensor unit at a controller, wherein the first sensor reading pertains to a parameter for a node of the energy storage device; (b) receiving a second sensor reading from a second sensor unit at the controller, wherein the second sensor reading also pertains to same parameter for the same node of the energy storage device; and (c) using the first and second sensor readings pertaining to the same node parameter to resolve an error with the sensor arrangement and/or the energy storage device.

BRIEF DESCRIPTION OF THE DRAWINGS

Preferred exemplary embodiments of the invention will hereinafter be described in conjunction with the appended drawings, wherein like designations denote like elements, and wherein.

DETAILED DESCRIPTION OF THE PREFERRED EMBODIMENTS

The sensor arrangement and method described below may be used with a variety of different energy storage devices, including battery packs found in hybrid vehicles, battery electric vehicles, and other types of vehicles. Such vehicles may also have battery electronics (e.g., a battery monitoring system) that monitors different cells or groups of cells within the battery pack. For instance, a battery monitoring system may keep track of the voltage, current, and/or temperature for dozens of different battery cells; this can result in hundreds or even thousands of sensor readings. If a battery monitoring system component—even one that provides just one of these sensor readings—malfunctions or otherwise experiences a fault condition, then it may be necessary to bring the entire vehicle in for service. The exemplary sensor arrangement described below, on the other hand, may still operate successfully in the event that certain malfunctions occur; this can greatly reduce the cost associated with servicing and/or replacing the battery electronics. Although the following exemplary description is provided in the context of a vehicle battery pack, it should be appreciated that the system and method described herein may be used with a number of other applications. For instance, the system and method may be used with other types of energy storage devices like fuel cells, as well as energy storage devices found in aircraft, watercraft, military vehicles, lawn and garden equipment, power tools, portable electronics like laptop computers, and more.

Figure 1:
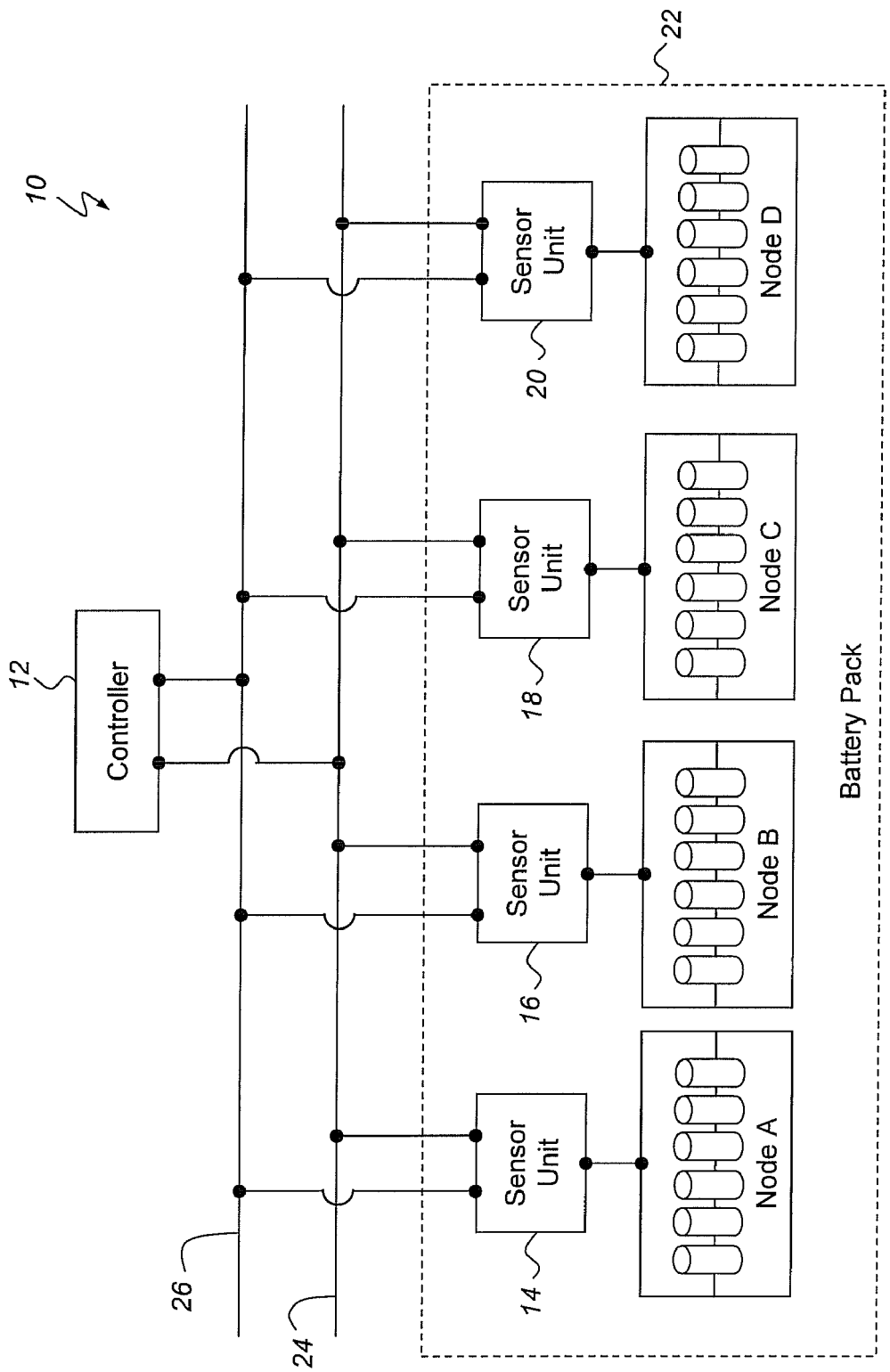
FIG. 1 is a schematic illustration of a conventional sensor arrangement used in a vehicle battery monitoring system.

With reference to FIG. 1, there is shown a schematic illustration of a sensor arrangement 10 that may be used with a vehicle battery pack and is arranged according to a conventional architecture. According to this particular example, sensor arrangement 10 is configured as a serial network that includes a controller 12 and four different sensors units 14-20 that are coupled to different nodes in battery pack 22. Each of the sensor units 14-20 is connected to controller 12 by two different connections; a first connection 24 (also referred to as the reporting lane) is used to report actual sensor readings and data from the sensor units to the controller, while a second connection 26 (also referred to as the check lane) is used to provide a single bit of information (e.g., a "0" or "1") from the sensor unit to the controller in order to indicate an error. For example, if one of the sensor units 14-20 detects a problem with the battery node that it is in charge of monitoring, then it can notify controller 12 by putting a "1" on connection (the check lane).

In operation, controller 12 monitors the various nodes within battery pack 22 by using the signals provided by sensor units 14-20 on connections 24, 26. For instance, controller 12 can check the validity of a sensor reading from sensor unit 14 sent over connection 24 by comparing it to other sensor readings provided by the other sensor units 16-20 over the same connection; this process is sometimes referred to as a "down-the-lane" evaluation because the sensor readings from one sensor unit are evaluated in the context of sensor readings from other sensor units provided over the same lane or connection. If, for example, the sensor reading from sensor unit 14 significantly differs from that of sensor unit 16, this may indicate that there is a faulty battery node and/or sensor unit. Controller 12 can also evaluate connection 26 or the check lane to see if any of the sensor units 14-20 have put out a "1" to indicate a battery node error. If the signals from either connection 24 or 26 indicate that an error has occurred, controller 12 can attempt to resolve the error or inform the driver of the potential malfunction. By using information from both connections 24 and 26 (i.e., the reporting and check lanes), sensor arrangement 10 may operate with redundancy; however, if there is a malfunction with any of the sensor units 14-20, that redundancy may be lost and the vehicle may need to be serviced.

Figure 2:
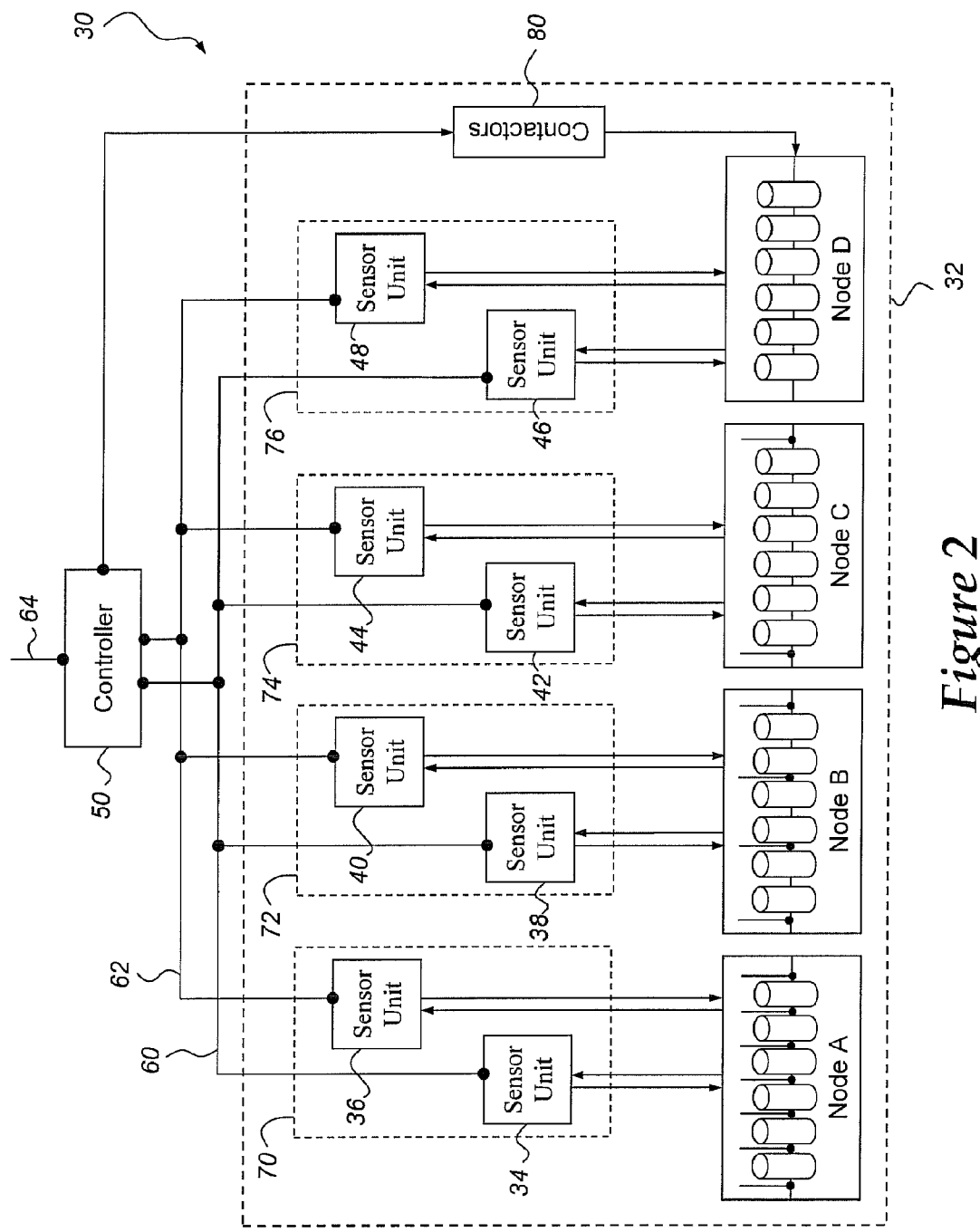
FIG. 2 is a schematic illustration of an exemplary sensor arrangement that may be used with any number of different energy storage devices, including the vehicle battery pack shown therein.

Turning now to FIG. 2, there is shown a schematic illustration of an exemplary sensor arrangement 30 that may be used with a variety of different energy storage devices, including a vehicle battery pack 32. According to the particular embodiment shown here, sensor arrangement 30 includes a number of sensor units 34-48, a controller 50, and connections 60, 62. Sensor arrangement 30 may be structured as a serial network (e.g., local interconnect network (LIN), controller area network (CAN), serial peripheral interface (SPI), FlexRay, RS485, etc.), as a parallel network, or as any other suitable wired or wireless network. This includes networks that use standard copper wires, fiber optics, power connections and/or wireless channels to communicate. It is also possible for sensor arrangement 30 to be part of a first system, like a battery monitoring system, and for the first system to be connected to and communicate with one or more other systems in the vehicle, like an engine management system, etc. These are, of course, only some of the potential embodiments as sensor arrangement 30 may be used in any number of different networks, systems, configurations, architectures, etc. and is not limited to the particular example shown and described here.

Sensor units 34-48 gather information from different nodes in battery pack 32 and communicate that information to controller 50 in the form of sensor readings. A "node" broadly includes any discrete entity or unit that is part of an energy storage device and can be monitored for certain parameters. In the context of a vehicle battery pack, a node may be a single battery cell, a battery group which is a collection of cells, some specific region or portion of the overall battery pack, or the entire battery pack itself. For instance, consider the example where battery pack 32 is a lithium-ion battery for a hybrid vehicle and includes ninety individual battery cells that are organized into fifteen battery groups having six cells each. Each of the sensor units 34-48 may be coupled to an individual battery cell, or each of the sensor units may be coupled to a battery group that includes a plurality of cells; both the individual battery cells and the collection or plurality of cells may be "nodes."

In an exemplary embodiment, sensor units 34, 36 are coupled to a battery group having six individual battery cells (node A); sensor units 38, 40 are coupled to a separate battery group having six individual battery cells (node B); sensor units 42, 44 are coupled to a separate battery group having six individual battery cells (node C); and sensor units 46, 48 are coupled to a separate battery group also having six individual battery cells (node D). It is not necessary that nodes A-D have six battery cells each, as they may have more or less battery cells. Also, each of the sensor units 34-48 is schematically shown being connected to a node by a pair of wires, where one wire is an input and one is an output; this is only a schematic representation of one possible arrangement. For example, each of the sensor units 34-48 may be individually coupled to each of the battery cells (this is illustrated with node A); each of the sensor units may be coupled to a series connection of two or more cells (this is illustrated with node B); or each of the sensor units may be coupled across an entire node with multiple battery cells (this is illustrated with node C), to cite a few examples. Also, FIG. 2 schematically shows each of the sensor unit pairs (e.g., 34 and 36, 38 and 40, 42 and 44, 46 and 48) with separate connections to their respective nodes. It is possible for a sensor unit pair to share connections to their respective node instead of having separate and distinct connections (e.g., the sensor readings for the pair of sensor units 34, 36 may be split on a printed circuit board (PCB) or the like so that the signal path braches off to each of the two sensor units, even though there is only one common set of wires attached to the battery cells). Other connection schemes and arrangements are certainly possible.

Sensor units 34-48 may be arranged or constructed according to one of a number of different possibilities. For instance, FIG. 2 shows an exemplary embodiment where pairs of sensor units (e.g., 34 and 36, 38 and 40, 42 and 44, 46 and 48) are arranged or included within electronic modules 70-76, which may include additional circuitry. Consider the example where sensor units 34, 36 are chips—such as the AD7280 chip sold by Analog Devices Inc.—with an output type (e.g., a SPI output) that is not directly compatible with connections 60, 62 (e.g., a CAN bus). In such an example, it may be necessary for module 70 to have additional circuitry for converting between SPI and CAN, as well as for performing any other needed functions like error handling, buffering, clocking, translating, etc. If sensor units 34, 36 have outputs that are directly compatible with connections 60, 62, then such conversion circuitry may be unnecessary. These and any other suitable components, devices, circuitry, etc. may be included within modules 70-76. It should be appreciated, however, that the schematic illustration shown in FIG. 2 is only one possible arrangement, as sensor units 34-48 may be arranged according to a number of different embodiments. For example, each sensor unit 34-48 could be provided by itself (i.e., without being integrated within a module, integrated circuit, etc.); a pair of sensor units could be included within a single module (as shown); a pair of sensor units could be integrated within a single application specific integrated circuits (ASIC) or the like; more than two sensor units could be included within a single module or ASIC; or all of the sensor units 34-48 could be included within a single module or ASIC, to name a few possibilities. Depending on the particular arrangement, the data processing and analyzing tasks of the battery electronics could be shared between the various sensor units 34-48, modules 70-76, and controller 50.

Sensor units 34-48 may sense and report on a variety of different node parameters. In the vehicle battery pack example provided above, sensor units 34-48 may provide controller 50 with sensor readings pertaining to node voltage, node current and/or node temperature, to cite a few possibilities. Other node parameters may be monitored and reported as well. It is also possible for sensor units 34-48 to provide output to the different nodes A-D (in addition to sensor readings from the nodes) and in one particular embodiment, the sensor units provide the nodes with cell balancing signals, instructions, etc. that may be used to perform cell balancing functions within the battery pack, as is understood by those skilled in the art. In one example, the cell balancing signals are used to control switches that bleed or otherwise reduce the charge on a particular battery cell or group of cells so that a relatively uniform charge is maintained across battery pack 32. Other input and output signals may also be exchanged between battery pack 32 and sensor units 34-48. It should be appreciated that sensor arrangement 30 may have more or less sensor units than those shown in the exemplary drawings, and battery pack 32 may have more or less nodes, cells, etc. than those shown as well.

Controller 50 communicates with sensor units 34-48 and evaluates the sensor readings and other data that they provide. According to an exemplary embodiment, controller 50 is a battery control module for a vehicle battery pack and it may: receive sensor readings from sensor units 34-48; evaluate or otherwise process the sensor readings (e.g., by executing electronic instructions needed to implement the method described below); send commands back to the sensor units, to failsafe contactors 80, to battery pack 32, etc.; and/or communicate with other components, devices, modules, networks, systems, etc., such as a battery charger, via connection 64. Controller 50 may include any memory means, communication means, and/or processing means (including multiple processing devices) needed to evaluate sensor readings and other information from sensor units 34-48. Because skilled artisans are knowledgeable about numerous types of battery control modules as well as their components—any one of which may be used with sensor arrangement 30—a complete description of such a device is omitted here. It is also possible for additional controllers or control modules to be connected to sensor units 34-48 via connections 60, 62 and to perform certain processing duties (e.g., light-duty battery monitoring functions) so that controller 50 can focus on higher level battery management issues. In one exemplary embodiment, controller 50 is physically mounted or located outside of battery pack 32 (illustrated in FIG. 2 where the controller is outside of the broken lines of the battery pack). Such an arrangement or construction may be beneficial for reducing the cost and effort associated with repairing controller 50. Instead of having to access, remove and/or possibly replace the entire battery pack 32, the controller 50 may be serviced by itself Connections 60, 62 connect sensor units 34-48 with controller 50 and may be provided according to a number of suitable arrangements. For example, connections 60, 62 may be individual serial connections, they may be bundled into a single combined serial connection, they may be a non-serial connection, they may be a wireless channel, or they may be provided in some other form. In an exemplary embodiment, connections 60, 62 (which are also referred to as "lanes") are separate CAN buses, where CAN bus 60 connects sensor units 34, 38, 42, 46 with controller 50, and CAN bus 62 connects sensor units 36, 40, 44, 48 with controller 50. By providing two separate connections between the sensor units and the controller, additional redundancy may be gained (e.g., in the event that there is a break or other malfunction in one of the connections). As stated above, the particular components and organization of sensor arrangement 30 shown here is simply exemplary and other arrangements, including those with more, less or different components, as well as different communication networks, protocols, etc. may be used instead. For more information regarding a connected area network (CAN), which is only one possibility for sensor arrangement 30, see *Controller Area Network—Basics, protocols, chips and applications* by Prof. Dr.-Ing. K. Etschberger.

Figure 3:
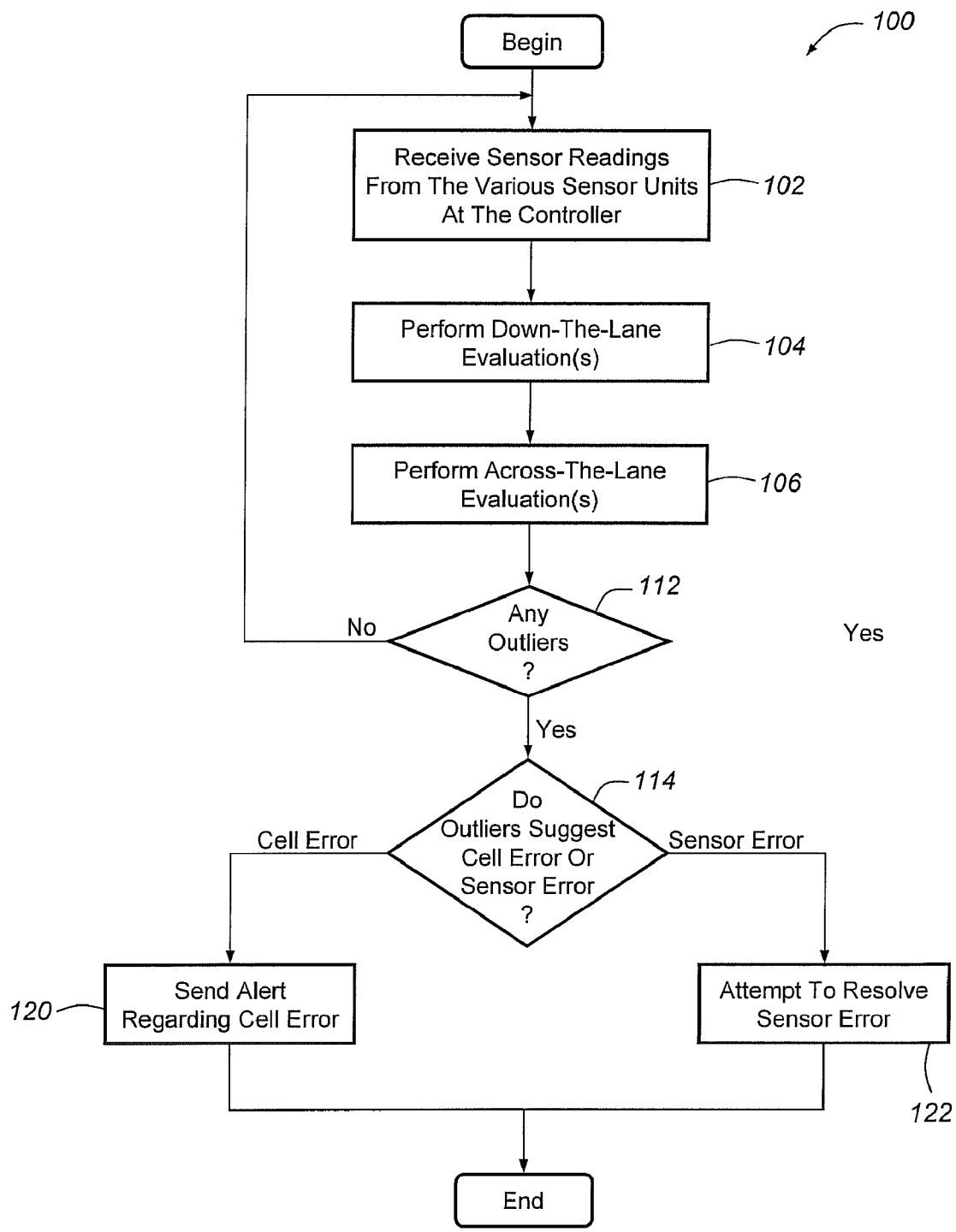
FIG. 3 is a flowchart illustrating an exemplary method for operating a sensor arrangement, such as the sensor arrangement shown in FIG. 2.

With reference to FIG. 3, there is shown a flowchart of an exemplary method 100 that may be used to improve the reliability, accuracy and/or robustness of a sensor arrangement, such as sensor arrangement 30. According to the following exemplary illustration, method 100 can generally be divided into two aspects: an error detection aspect (steps 102-112) and an error resolution aspect (steps 114-122). The error detection side of method 100 generally attempts to identify errors with the sensor arrangement and/or the energy storage device. The error resolution side of method 100 attempts to resolve any errors that are identified so that accurate sensor readings can still be provided and used. Because sensor arrangement 30 provides multiple sensor readings for each node being evaluated, method 100 can enable the sensor arrangement to continue operating accurately and with redundancy even if it experiences a loss of one or more sensor units. This differs from previous sensor arrangements that may require costly service events if one or more sensor units experience a malfunction. It should be appreciated that the "error detection" and "error resolution" aspects described above are simply provided for purposes of illustration, and that the actual algorithm or executable code that is used to implement the present method may or may not be so definitively partitioned into these two aspects.

Beginning with step 102, sensor readings are received from the various sensor units 34-48 at controller 50. This step may be accomplished in a number of different ways. For example, controller 50 could put out requests on connections 60, 62 that cause sensor units 34-48 to individually respond and provide sensor readings one-at-a-time, or instead the sensor units could provide the controller with sensor readings on a periodic basis, without being requested. The preceding examples are only two of the potential ways in which sensor readings may be gathered from sensor units 34-48, as any suitable technique for gathering sensor readings from sensor units may be used here. This includes techniques using different physical layers. Also, the sensor readings may be provided on a cell-by-cell basis, a cell group-by-cell group basis, or otherwise. For example, step 102 may gather two cell voltage and two cell temperature readings that pertain to the same battery cell during each reporting cycle (e.g., one from sensor unit 34 and one from sensor unit 36). It is also possible to vary the sampling schemes, as both sensor units are not required to gather data every cycle, although they could. For example, sensor unit 34 may gather sensor readings every cycle while sensor unit 36 gathers sensor readings every five, ten, one hundred cycles, etc.

In step 104, one or more "down-the-lane" evaluations or checks are performed in order to identify any outliers. As previously mentioned, a down-the-lane evaluation broadly includes any evaluation or comparison of a sensor reading in the context of other sensor readings from other sensor units that are also provided over the same lane or connection; that is, an "intra-lane" evaluation. For example, a down-the-lane evaluation for sensor unit 34 may involve evaluating that sensor reading in the context of other sensor readings from sensor units 38, 42 and/or 46, as they are all connected to controller 50 via the same connection or lane 60. Skilled artisans will appreciate that a number of different types of down-the-lane comparisons may be performed on the sensor readings, including the following exemplary ones.

Figure 4:
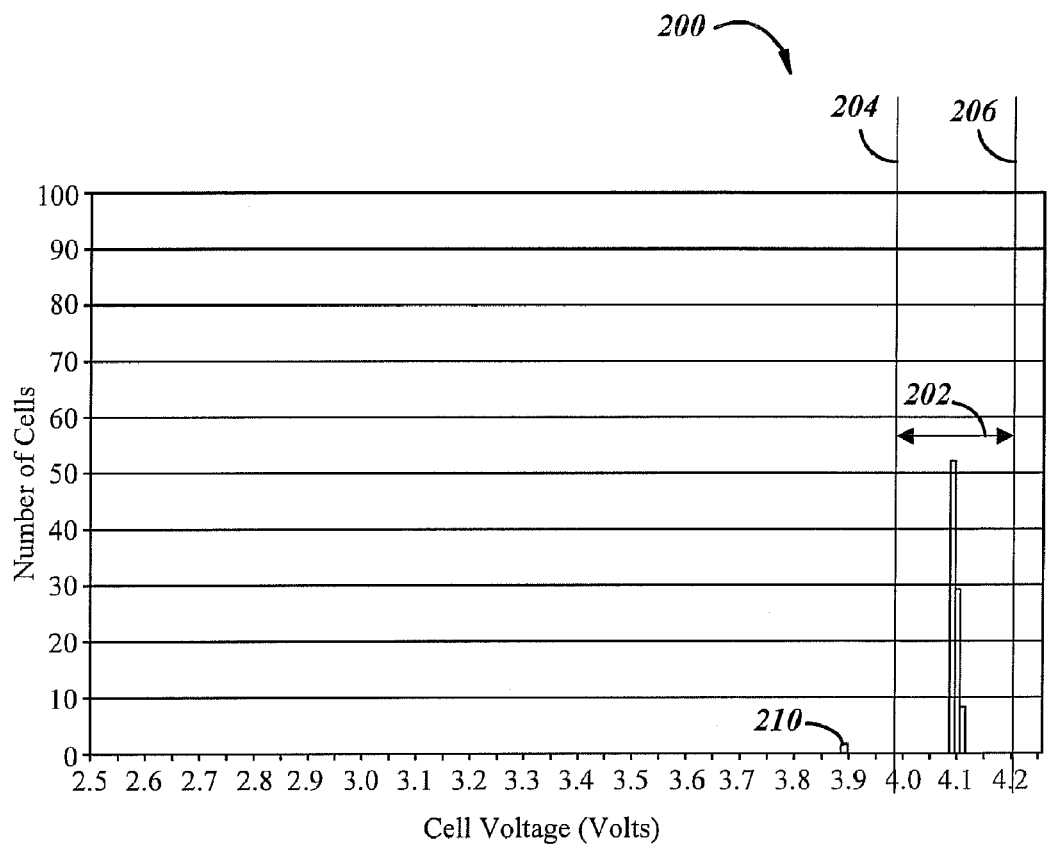
FIG. 4 is a chart in the form of a histogram, where the histogram displays a number of exemplary sensor readings that may be generated by a sensor arrangement, such as the sensor arrangement shown in FIG. 2.

Turning to FIG. 4, there is shown an exemplary graph 200 that is in the form of a histogram and illustrates different down-the-lane evaluation techniques that may be used in step 104. Graph 200 is set up to illustrate a distribution of cell voltage readings collected from the various sensor units, and has cell voltage on the x-axis and the number of cells registering a certain cell voltage on the y-axis. Of course, similar graphs and techniques may be used with other battery parameters, such as cell temperature and/or cell current, as cell voltage is simply being used here as one example. In a first exemplary down-the-lane evaluation, the overall distribution of cell voltages is evaluated to see if any outliers fall outside of an acceptable window 202 that is bound by lower and upper limits or bands 204, 206. Acceptable window 202 may be predetermined and static (e.g., the window may always be 0.2V wide and centered around the statistical median of the cell voltage distribution), or it may be dynamically determined In one example, step 104 recognizes that the acceptable window 202 may need to vary depending on different conditions within the battery pack; for instance, during times of rapid change in battery current or temperature the acceptable window 202 may need to be larger in order to accommodate the wider distribution of readings that are expected. The acceptable window 202 may also be influenced by the measurement error of the various sensor readings. During times of more stability, the acceptable window 202 may be smaller or tighter, as it is expected that the distribution of voltage readings will be in a tighter range. Other techniques and parameters may be used to determine the acceptable window 202 and/or set the lower and upper limits 204, 206. Also, it is not necessary for the method to actually create or use a histogram, as the histogram shown in FIG. 4 is simply provided for purposes of illustration and could be substituted by the method with mathematical and/or statistical computations.

Consider the example above where battery pack 32 has ninety individual battery cells that are grouped into fifteen battery groups or nodes of six cells each. In such a scenario, all of the sensor units coupled to connection 60 (this would include sensor units 34, 38, 42, 46, plus eleven other sensor units not shown in FIG. 2) provide controller 50 with voltage readings for the ninety battery cells in battery pack 32; chart 200 generally represents such a voltage reading distribution. If one or more voltage readings 210 were to fall outside of acceptable window 202, then they are considered an outlier. This technique of identifying outliers by performing a down-the-lane evaluation may be performed at a single snapshot in time or, more likely, could be performed over a certain time period using any number of filtering, debouncing and/or other techniques. It is possible for the acceptable window 202 to move over time to accommodate changes in the sensor reading distribution. The process of determining the lower and upper limits could be performed during each evaluation cycle or it could be performed once every so many evaluation cycles, to cite two examples. A separate down-the-lane evaluation may be performed for other node parameters, such as battery cell temperature. It is also possible to check to make sure that none of the voltage readings fall outside of absolute or global maximum and minimum voltage levels (e.g., a global maximum of 4.5V and a global minimum of 2.0V); that is, voltage limits that are static and are not impacted by the particular distribution of the voltage readings.

In a second exemplary down-the-lane evaluation, the various cell voltage readings are compared to one another to identify any outliers where two or more cell voltages are consistently the same for a certain amount of time; a condition sometimes referred to as "shadowing" or a "stuck MUX." If sensor arrangement 30 has problems associated with writing sensor readings into certain memory locations, for example, then a condition could arise where the sensor reading for the second cell is always written into the memory location for both the first and the second cells; this results in the first and second cell readings always being the same. It is possible for step 104 to perform a check each evaluation cycle on all of the sensor readings or only a portion or sample of the sensor readings to determine if such a shadowing condition exists. It would be very unlikely for two separate cells to consistently register the same exact cell voltage for a significant amount of time or a certain number of readings in a row, for example. Other techniques that may be used include varying up the sampling order or the sampling rate, using sweeping or rolling sampling techniques, etc.

In a third exemplary down-the-lane evaluation, the various cell voltages are compared to one another to identify any outliers that do not exhibit similar trends with the other sensor readings in response to changing conditions with battery pack 32. In many battery packs, the cells are connected in series so that loads and other phenomena that are experienced by one cell are likely experienced by the other cells as well; thus, certain trends may be able to be discerned. For instance, if there is a sudden increase in the amount of current flowing out of battery pack 32, then the voltage across all of the cells should rise and fall together. If one of the cells has a decreasing cell voltage while all of the other cells have increasing cell voltages, this may be a sign that something is wrong with either the battery cell or the sensory that is monitoring it. If during the same increase in battery current, all of the cells experience a comparable or similar rate of battery voltage change, save one or two cells. Then there may be some type of malfunction (either with the cell or the sensors); thus, these cells would be flagged as outliers for further analysis. It should be appreciated that there are numerous techniques—mathematical, statistical and otherwise—that may be used to detect outliers from the distribution of sensor readings collected in step 104. Any one of which may be used here.

Next, the same or similar "down-the-lane" evaluations may be performed on the other lane or connection. So, if all of the sensor readings from connection 60 are evaluated first, then all of the sensor readings from connection 62 may be evaluated next, and vice-versa. The precise order and manner of these evaluations is not critical, as a variety of possibilities exists. At the end of step 104, the different down-the-lane evaluations for both connections 60 and 62 should be performed and any resulting outliers identified. Such evaluations may identify sensor errors such as "silent mode" errors where a sensor unit simply fails to provide a sensor reading, "fixed offset" errors where a sensor unit consistently outputs a sensor reading plus or minus a certain amount, and "bit shift" errors where a sensor unit writes the sensor reading into the wrong memory location, to cite a few possibilities, as these errors oftentimes account for many of the malfunctions that occur. It may be helpful to perform the two down-the-lane comparisons in a relatively tight window of time (i.e., generally contemporaneously) so that the conditions seen by the two lanes are generally the same. Some errors may affect a single battery cell, all of the battery cells within a node, a single sensor unit, all of the sensor units within an electronic module, or all of the components attached to a particular connection. Depending on the nature of the error or malfunction, the affected components may be isolated by method 100 and the corrupted sensor readings resolved.

Next, step 106 performs one or more "across-the-lane" evaluations or checks in order to identify any outliers. An across-the-lane evaluation generally involves evaluating or comparing a sensor reading in the context of other sensor readings from other sensor units that are provided over a different lane or connection; that is, an "inter-lane" evaluation. For example, an across-the-lane evaluation for sensor unit 34 may involve evaluating sensor readings from sensor units 36, 40, 44 and/or 48, as they are all connected to controller 50 via connection 62 instead of connection 60. Skilled artisans will appreciate that a number of different types of across-the-lane comparisons may be performed on the sensor readings, including the following exemplary ones.

According to a first exemplary across-the-lane evaluation, voltage readings from corresponding sensor units are compared in order to identify any outliers where the voltages for the same battery cell differ by a certain amount. For example, sensor units 34 and 36 are both coupled to battery node A which includes battery cells 1-6. If sensor units 34 and 36 both report a cell voltage reading of 3.6V for cell 1, then there is good correspondence which suggests that the voltage readings are probably correct. A certain amount of tolerance can be built into this across-the-lane comparison; for example, 0.05V. If sensor unit 34 reports 3.6V for cell 1 and sensor unit 36 reports 3.64V for cell 1, then these readings would not be flagged as outliers, as they are within the allowed tolerance amount. If, however, sensor unit 34 reports a cell 1 voltage of 3.6V and sensor unit 36 reports a cell 1 voltage of 4.0V, then step 106 may flag either or both of these sensor readings as outliers. A certain time window may need to be employed—for example, a time window of 10 msec to 1 sec—to make sure that the readings are generally acquired contemporaneously so that the conditions seen by one sensor are similar to those seen by the other. Similar across-the-lane evaluations may be performed on a cell-by-cell basis, a cell group-by-cell group basis, or some other basis. For instance, the average voltage for cells 1-6 (node A) from sensor unit 34 may be compared against those for cell 1-6 (node A) from sensor unit 36. Other variations of this and other across-the-lane evaluations are certainly possible. For instance, step 106 may look across-the-lane to make sure that there is correspondence in sensor readings in an absolute sense or in a trending sense.

Another potential across-the-lane comparison involves the use of a "target" or "golden" reading to identify potential outliers. If, after one or more comparisons or other analyses, step 106 is confident that the voltage readings for a particular cell or node are accurate, then it is possible to use that cell voltage as a target against which the other cell voltages can be compared. Skilled artisans will appreciate that well balanced battery packs include a number of individual cells that usually have cell voltages within a relatively tight range; that is, the voltage from cell to cell does not vary by much. If a target cell is identified where there is a high degree of confidence that the voltage reading is accurate, the other cells can be compared to the target reading to determine if they differ from the target reading by a certain amount. Consider the example where both down-the-lane and across-the-lane evaluations suggest that cell 1 has a cell voltage of 3.5V and a tolerance of ±0.15V is allowed. All of the other cell voltages, from connections or lanes 60 and 62, could be compared to this target reading to make sure that they have a cell voltage of between 3.35V-3.65V. If they fall outside of this range, they may be considered outliers. A target reading may be created for a single battery cell, for a group of cells (e.g., a node), etc.; for example, if the total voltage for node A is confidently determined to be 21.0V, then this target reading could be used to compare or evaluate other nodes, instead of doing so on a cell-by-cell basis. It should be appreciated that using a target reading for purposes of evaluating sensor readings can lead to a reduction in processing and/or memory requirements, which may be an important design goal for certain vehicle applications. Other across-the-lane evaluations may be performed as well.

Step 112 checks to see if any outliers were identified in the previous steps. If no outliers were detected, then the method may return to step 102 for another measurement cycle. If one or more outliers were detected, then the method continues to step 114 to begin the process of resolving such potential errors.

Step 114 attempts to determine if the outliers are due to errors or malfunctions in the battery pack 32 (e.g., battery cell errors) or errors or malfunctions with sensor arrangement 30 (e.g., architectural errors like sensor or wiring errors). If there are repeat outliers, then this implies that the error is in the battery pack. For instance, consider the example where a first down-the-lane evaluation in step 104 identifies cell 1 as an outlier (say the sensor reading was reported by sensor unit 34 on connection 60) and a second, separate down-the-lane evaluation also identifies cell 1 as an outlier (say this sensor reading was reported by sensor unit 36 on connection 62). This corroboration between the sensor readings suggests that the sensors are operating correctly and reporting accurate readings, but the actual battery cell itself is experiencing some type of malfunction that is causing it to be an outlier. Such a discrepancy could also be resolved by using the previously described across-the-lane evaluation to see if the two sensor readings support one another. Any combination of techniques, comparisons, evaluations, etc. could be used here to determine if an outlier is representative of a cell error or a sensor error, and step 114 is not limited to any particular one. If step 114 determines that the outliers are due to errors with battery pack 32, then step 120 may inform the driver of this malfunction within the battery pack and any number of remedial actions may be taken. For example, a warning could be sent to the driver and/or call center (e.g., via wireless communication) to inform them of the battery pack malfunction; power could be rerouted around the affected cell; etc. If step 114 determines that the outliers are due to errors with sensor arrangement 30, then step 122 may ignore the sensor readings from the malfunctioning sensor unit and corroborate the sensor readings from the other corresponding sensor unit (i.e., the other sensor unit of the sensor unit pair) so that accurate sensor data can still be obtained.

In step 122, the method attempts to resolve the apparent sensor error and may do so by using information from connections 60 and/or 62. Put differently, step 122 may corroborate the sensor readings from the properly functioning sensor unit by performing one or more down-the-lane and/or across-the-lane evaluations. For example, if the previous steps suggest that the cell voltage for cell 1 that is provided by sensor unit 34 over connection 60 is corrupted (i.e., the bad sensor reading), then step 122 may decide to ignore the sensor readings from sensor unit 34 and instead use the cell 1 sensor readings from sensor unit 36 over connection 62 (i.e., the good sensor reading); but there has to be a high level of confidence that the good sensor reading is accurate. In one embodiment, step 122 may corroborate the good sensor reading by comparing it with a target reading, as described above. If the good sensor reading is within a certain tolerance of the target reading, then step 122 may have enough confidence to report and use that voltage reading. There is redundancy because the sensor reading is verified or corroborated by at least one other independent source; in this case, the target reading or target cell voltage. In another example, step 122 may validate the "good sensor reading" by performing a down-the-lane evaluation of the good sensor unit reading; that is, step 122 may compare the good sensor reading from sensor unit 36 to other sensor readings provided over connection 62. The following evaluations are simply examples of some of the techniques that could be used to verify the integrity of the good sensor reading, as others may be used as well: the good sensor reading from sensor unit 36 could be evaluated with the other sensor readings on connection 62 to see if it falls within an acceptable window, as discussed above; the good sensor reading from sensor unit 36 could be evaluated with the other sensor readings on connection 62 to see if it trends in a similar way (e.g., rising and/or falling voltage levels during times of changing battery current); the good sensor reading could be evaluated using any combination of down-the-lane, across-the-lane and/or target reading evaluations, as described above.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, the method, steps, examples, etc. provided above are not limited to cell voltage and may be used with other parameters, like cell temperature and cell current, as well. Also, it is worth noting that the error detection aspects described above (e.g., steps 102-112) may be used with other techniques and methods and are not limited to the error resolution aspects described above (e.g., steps 114-122), and vice-versa. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A method of using a sensor arrangement that evaluates an energy storage device, comprising the steps of:
   (a) receiving a first sensor reading from a first sensor unit at a controller, wherein the first sensor reading pertains to a parameter for a node of the energy storage device;
   (b) receiving a second sensor reading from a second sensor unit at the controller, wherein the second sensor reading also pertains to the same parameter for the same node of the energy storage device; and
   (c) using the first and second sensor readings pertaining to the same node parameter to detect an error with the sensor arrangement and/or the energy storage device.

2. The method of claim 1, wherein a first connection couples the first sensor unit and a first plurality of additional sensor units to the controller, and a second connection couples the second sensor unit and a second plurality of additional sensor units to the controller.

3. The method of claim 2, wherein step (c) further comprises performing one or more down-the-lane evaluation(s) that involve the first sensor reading and sensor readings from the first plurality of additional sensor units, wherein the down-the-lane evaluation(s) are used to detect an error with the sensor arrangement and/or the energy storage device.

4. The method of claim 3, wherein the down-the-lane evaluation(s) identify any sensor readings that are outliers which fall outside of an acceptable window for a sensor reading distribution that is bound by lower and upper limits.

5. The method of claim 4, wherein the acceptable window is dynamically determined depending on conditions within the energy storage device.

6. The method of claim 3, wherein the down-the-lane evaluation(s) identify any sensor readings that are outliers where two or more sensor readings are consistently the same for a certain amount of time.

7. The method of claim 3, wherein the down-the-lane evaluation(s) identify any sensor readings that are outliers which do not exhibit similar trends with the other sensor readings in response to changing conditions within the energy storage device.

8. The method of claim 2, wherein step (c) further comprises performing one or more across-the-lane evaluation(s) that involve the first sensor reading and at least one sensor reading from the second sensor unit or the second plurality of sensor units, wherein the across-the-lane evaluation(s) are used to detect an error with the sensor arrangement and/or the energy storage device.

9. The method of claim 8, wherein the across-the-lane evaluation(s) identify any sensor readings that are outliers where sensor readings from the first sensor unit and the second sensor unit differ by a certain amount.

10. The method of claim 8, wherein the across-the-lane evaluation(s) are used to identify a target reading, and one or more sensor readings from the first plurality of sensor units or the second plurality of sensor units are compared to the target reading to identify any outliers which differ from the target reading by a certain amount.

11. The method of claim 1, wherein step (c) identifies one or more outlier(s) and determines if the outliers are due to errors with the sensor arrangement or errors with the energy storage device.

12. The method of claim 11, wherein if the outlier(s) are due to errors with the energy storage device, then the method further comprises the step of:
   (d) sending a warning to a driver and/or call center informing them of the energy storage device malfunction.

13. The method of claim 11, wherein if the outlier(s) are due to errors with the sensor arrangement, then the method further comprises the steps of:
   (d) ignoring bad sensor readings from the first sensor unit, wherein the bad sensor readings pertain to the node parameter; and
   (e) corroborating good sensor readings from the second sensor unit, wherein the good sensor readings also pertain to the same node parameter.

14. The method of claim 13, wherein step (e) further comprises corroborating the good sensor readings from the second sensor unit by performing one or more down-the-lane evaluations.

15. The method of claim 13, wherein step (e) further comprises corroborating the good sensor readings from the second sensor unit by comparing the good sensor readings with a target reading.

16. A method of using a sensor arrangement that evaluates an energy storage device, comprising the steps of:
   (a) receiving a first sensor reading from a first sensor unit at a controller, wherein the first sensor reading pertains to a parameter for a node of the energy storage device;
   (b) receiving a second sensor reading from a second sensor unit at the controller, wherein the second sensor reading also pertains to the same parameter for the same node of the energy storage device; and (c) using the first and second sensor readings pertaining to the same node parameter to resolve an error with the sensor arrangement and/or the energy storage device.

17. The method of claim 16, wherein a first connection couples the first sensor unit and a first plurality of additional sensor units to the controller, and a second connection couples the second sensor unit and a second plurality of additional sensor units to the controller.

18. The method of claim 17, wherein step (c) identifies one or more outlier(s) and determines if the outliers are due to errors with the sensor arrangement or errors with the energy storage device.

19. The method of claim 18, wherein if the outlier(s) are due to errors with the energy storage device, then the method further comprises the step of:

(d) sending a warning to a driver and/or call center informing them of the energy storage device malfunction.

20. The method of claim 18, wherein if the outlier(s) are due to errors with the sensor arrangement, then the method further comprises the steps of:

(d) ignoring bad sensor readings from the first sensor unit, wherein the bad sensor readings pertain to the node parameter; and (e) corroborating good sensor readings from the second sensor unit, wherein the good sensor readings also pertain to the same node parameter.

21. The method of claim 20, wherein step (e) further comprises corroborating the good sensor readings from the second sensor unit by performing one or more down-the-lane evaluations.

22. The method of claim 20, wherein step (e) further comprises corroborating the good sensor readings from the second sensor unit by comparing the good sensor readings with a target reading.

* * * * *